(12) United States Patent
Lin

(10) Patent No.: US 6,376,274 B1
(45) Date of Patent: *Apr. 23, 2002

(54) PROCESS FOR PRODUCING PHOTOSENSOR WITH COLOR FILTER

(75) Inventor: Shih-Yao Lin, Hsin-Chu (TW)

(73) Assignee: United Microelectronics Corp., Hsin-Chu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/344,762

(22) Filed: Jun. 25, 1999

(51) Int. Cl.$^7$ ............................................. H01L 21/70
(52) U.S. Cl. ........................................ 438/57; 438/70
(58) Field of Search .................. 438/57, 60–69, 438/70, 75, 98, 623, 720, 754, 725, 700; 430/7

(56) References Cited

U.S. PATENT DOCUMENTS

| | | | | |
|---|---|---|---|---|
| 4,948,706 A | * | 8/1990 | Sugihara et al. | 340/311 |
| 5,132,251 A | * | 7/1992 | Kim et al. | 438/70 |
| 5,143,855 A | * | 9/1992 | Pace et al. | 438/70 |
| 5,455,624 A | * | 10/1995 | Ishibe et al. | 348/340 |
| 5,650,867 A | * | 7/1997 | Kojima et al. | 349/104 |
| 5,711,890 A | * | 1/1998 | Hawkins et al. | 257/440 |
| 5,718,991 A | * | 2/1998 | Lin et al. | 430/5 |
| 5,719,075 A | * | 2/1998 | Hawkins et al. | 438/75 |
| 5,889,277 A | * | 3/1999 | Hawkins et al. | 438/70 |
| 5,914,749 A | * | 6/1999 | Bawolek et al. | 348/273 |
| 5,970,317 A | * | 10/1999 | Mizoguti et al. | 438/70 |

* cited by examiner

*Primary Examiner*—Savitri Mulpuri
(74) *Attorney, Agent, or Firm*—Powell, Goldstein, Frazer & Murphy

(57) ABSTRACT

A method for forming photo-sensitive device is disclosed. The method includes providing a substrate with a transparent, planarized insulator. Then, one color filter layer is formed on a photo-receiving region of the substrate. A conductive layer is deposited on the substrate and defined to expose the photo-receiving region. Then, a passivation layer is coated on the partially fabricated device to protect the color filter.

10 Claims, 5 Drawing Sheets

PROCESS FOR PRODUCING PHOTOSENSOR WITH COLOR FILTER

BACKGROUND OF THE INVENTION

1. Field of the Invention

The present invention relates to a semiconductor device fabrication, and more particularly to a method for forming a photosensitive device with color filter.

2. Description of the Prior Art

FIGS. 1 are schematic representations of structures at last stages during the formulation of photo-sensitive device using the conventional, prior technology. Referring to FIG. 1A, a planarized inter-metal dielectric layer 100 with a photo-receiving region 130 is formed. A metal layer 114 is deposited and defined to expose the photo-receiving region 130 on the inter-metal dielectric layer 100. Then, a passivation layer 150 is formed on to protect the sensitive device below.

Referring to FIG. 1B, because a planar layer is needed for following color filter process, a coated planar film 152 or coated spin-on glass with etching-back process is performed. Both planar film 152 and passivation layer 150 are transparent. Then, a color filter process, comprising coating R G B filters, development, etching and top coating, is performed to form color filter 112. Next, another passivation layer 120 is coated on to cover the color filter 112 and planar film 152. FIG. 2 is a flow diagram showing the steps of forming color filter according to the above conventional process with six main steps.

The above description, however, has a high cost and long cycle time because of many steps in the process. Furthermore, multi-transparent layers will give a low transimittance rate and yield.

SUMMARY OF THE INVENTION

In accordance with the present invention, a method is provided for forming photo-sensitive device that substantially reduces the cost comparing to the prior method. This is performed by reducing process steps and raw material due to the process steps are reversible.

It is another object that the present invention reduces the cycle time by reducing the planar film and passivation layer for color filter.

It is still another object that this invention increases the transimittance rate by reducing the planar film and yield.

In one embodiment, a planarized insulator with a photo-receiving region formed in is provided. Then, at least one color filter pattern is formed on the photo-receiving region by using conventional method. Next, a conformal conductive layer is formed on said insulator. A passivation layer over said partially fabricated device is formed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1A:
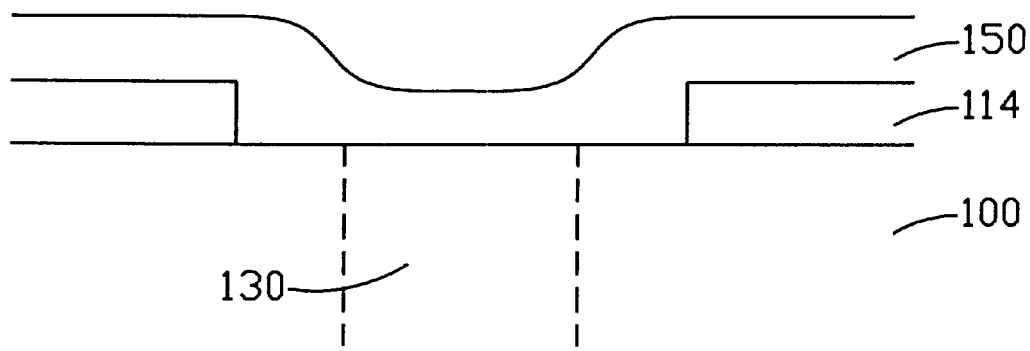
FIGS. 1A to 1B are schematic representations of structures at last stages during the formulation of the photo-sensitive device using conventional, prior technology.
Figure 1B:
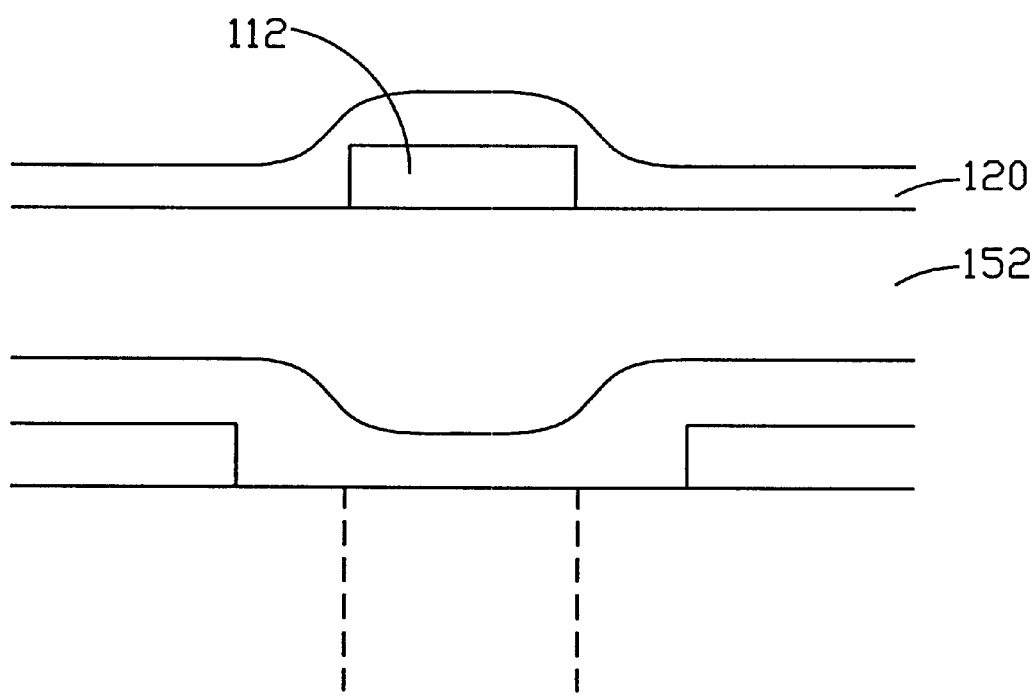
Figure 2:
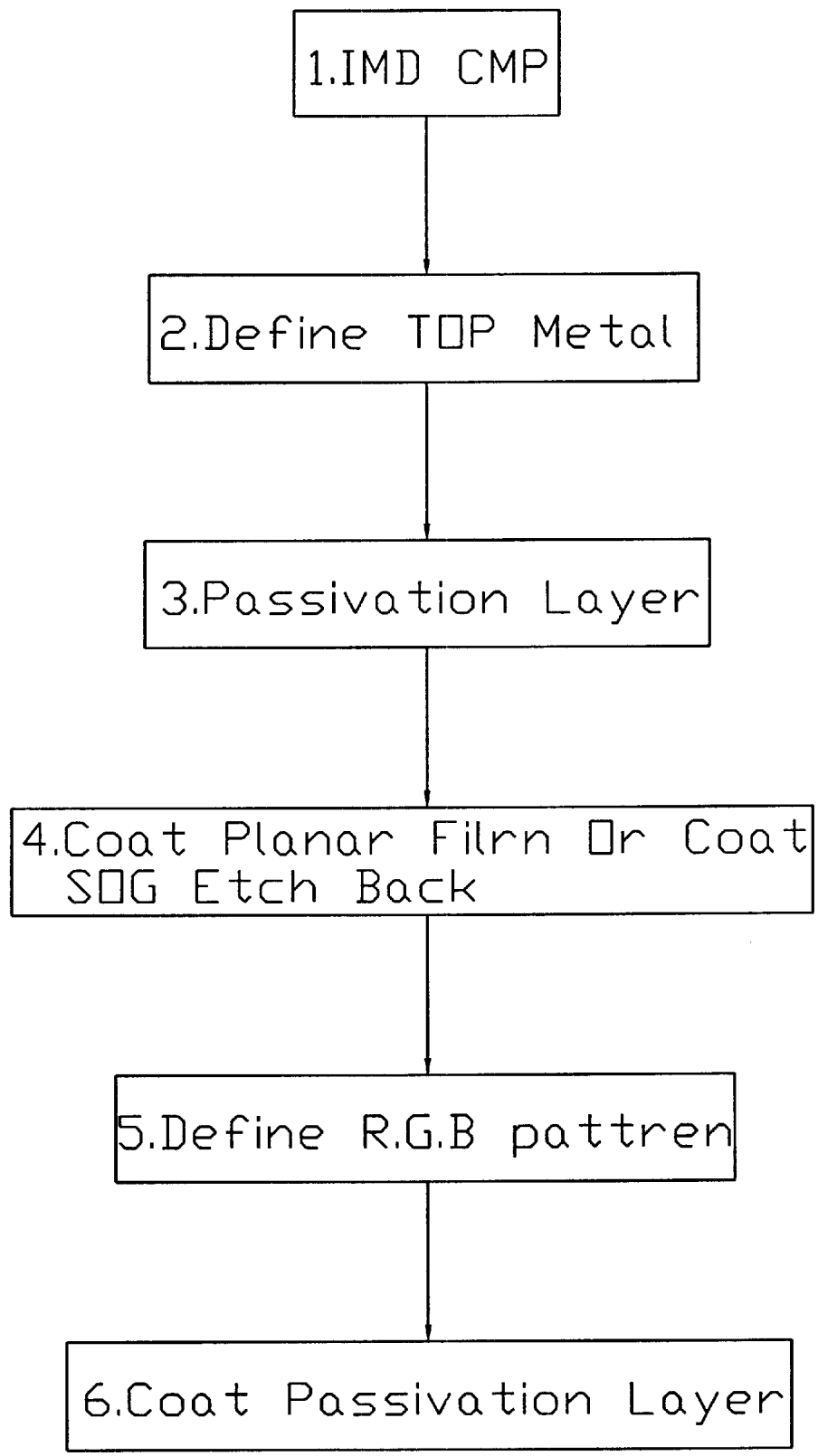
FIG. 2 is a flow diagram showing the steps for forming a photo-sensitive device in accordance with a conventional, prior method.
Figure 3:
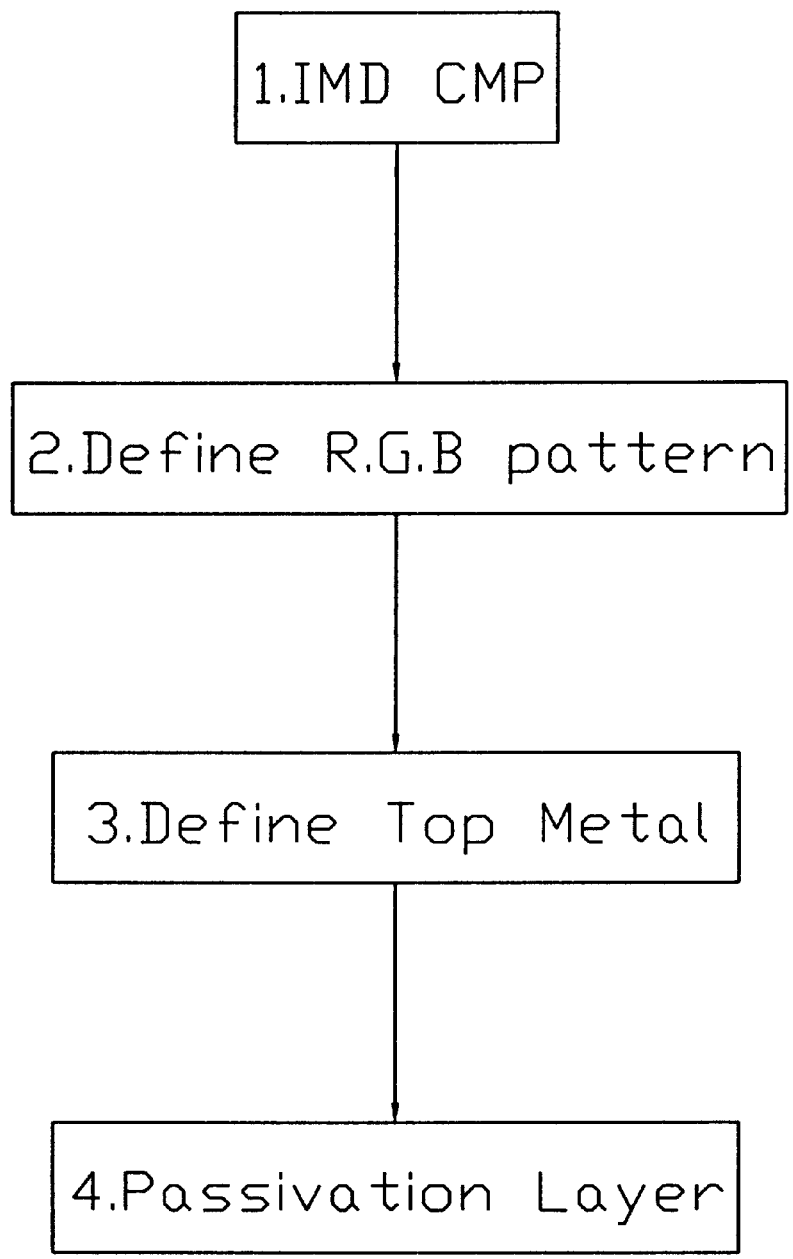
FIG. 3 is a flow diagram showing the steps for forming a photo-sensitive device in accordance with a method disclosed herein.

FIG. 3 is a flow diagram summarizing the steps in one method of forming a photo-sensitive device in accordance with this disclosure. First, a planarized inter-metal dielectric layer is formed on a substrate to expose a photo-receiving region. Next, at least one color filer layer is formed on the photo-receiving region of the inter-metal dielectric layer. A conformal conductive layer which is the top metal layer of the photo-sensitive device is formed on the inter-metal dielectric layer. Then, a passivation layer is formed on the device to protect both color filter and metal layer. Suitable conditions for performing the various steps set forth in FIG. 3 are set forth below and will be explained by reference to FIGS. 4A–E.

Figure 4A:
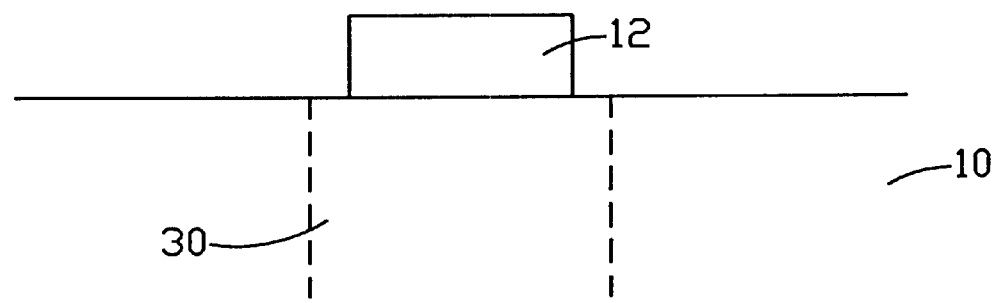
FIGS. 4A to 4E are schematic representations of structures at last stages during the formulation of the photo-sensitive device in accordance with a method disclosed.

Referring to FIG. 4A, a substrate useful in forming a layered semiconductor device is shown wherein a planarized insulator layer 10 has a photo-receiving region 30 formed therein. This insulator layer 10 is the last inter-metal dielectric layer in photo-sensitive device and can be planarized by using chemical mechanical polishing to reach the global planarization. The photo-receiving region 30 is a light receiving region and will have a converter (not shown in FIGS.) to transfer light into current. Hence, the material of this inter-metal dielectric layer 10 is transparent and can be made from any typical and well-known dielectric material used in sensor device, but is preferably silicon oxide.

A color filter layer 12 is formed on the planarized insulator layer 10 by using any conventional method. In this embodiment, one color filter 12 is formed on the photo-receiving region 30.

Figure 4B:
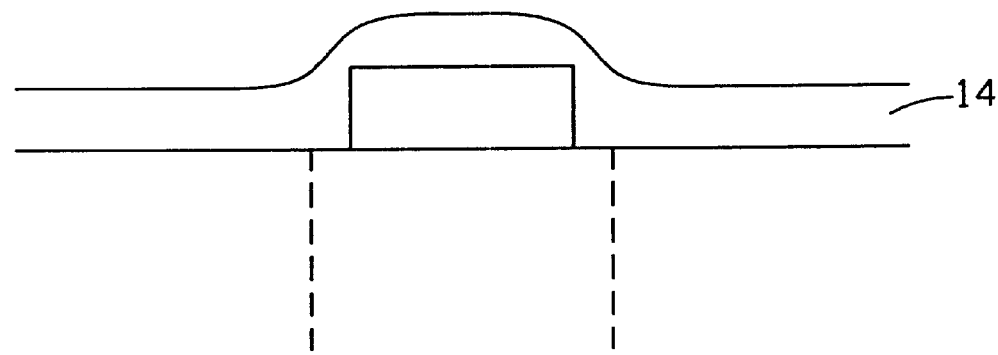

Referring to FIG. 4B, a conductive layer 14 is deposited on the partially fabricated device. The material of this layer 14 can be Al and formed using any known technique such as reactive sputtering process (with or without collimation) wherein sputtering is carried out in Ar+N2 atmosphere using an Al target. The thickness of this conductive layer 14 can be in the range of about 8000 angstroms to about 10000 angstroms.

Figure 4C:
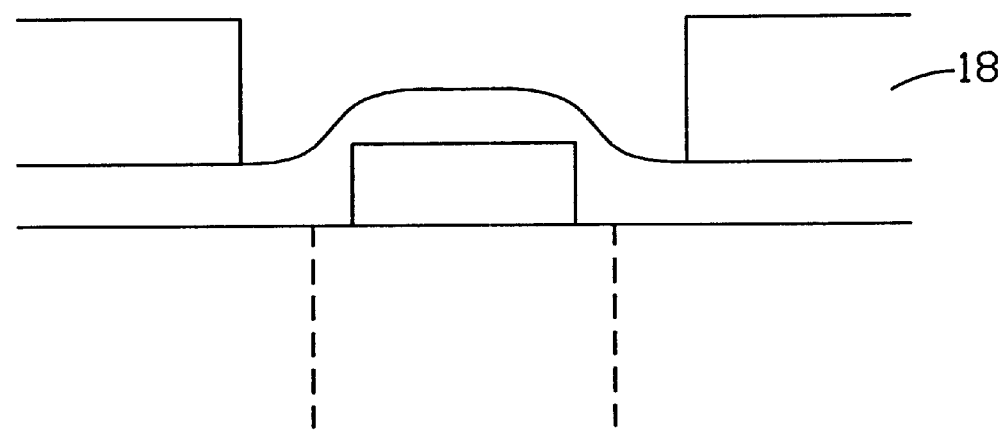

Referring to FIG. 4C, a photoresist layer 18 is then formed and patterned on the conductive layer 14 using conventional photolithographic technology, defining a metal area to expose the photo-receiving region 30 over a portion of the insulator layer 10.

Figure 4D:
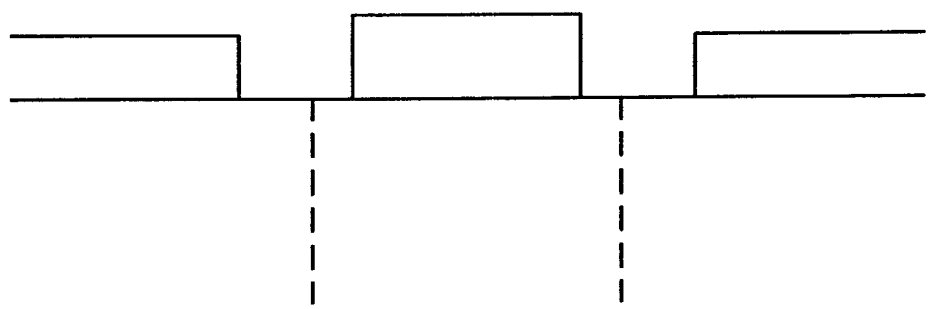

Thereafter, an anisotropically etching process is performed, using the photoresist layer 18 as a mask. In this embodiment, any suitable dry etching method is performed to etch this conductive layer 14. Any other solution with high selectivity is capable to etch conductive layer 14. This etching process exposes color filter 12 and a portion of the insulator layer 14 comprising photo-receiving region 30. Then, the photoresist layer 18 is removed by using any well-known technology, as shown in FIG. 4D.

Figure 4E:
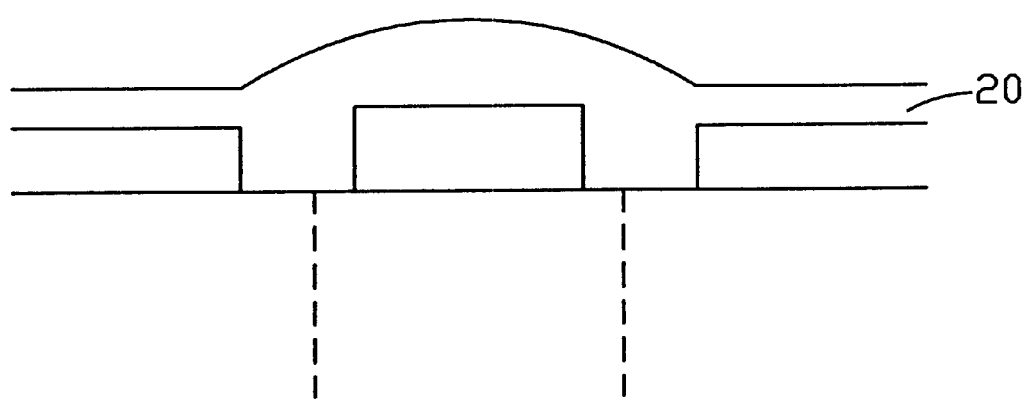

Then, a passivation layer 20 is conformally formed on the device to protect this device by using any conventional method, as shown in FIG. 4E. Because this layer 20 is the top layer of sensor device, the passivation layer 20 dose not need to be planarized. The raw material of this passivation layer 20 is polymer or polyimide.

From the process of this invention, two passivation layers and one planarization step(one passivation layer on the metal layer and one planarized layer) are reduced, so the cost of raw material reduces about 14US$/wafer while machine is about 5US$/wafer. Moreover, the reduced materials will increase transparent rate about 9%.

Although specific embodiments have been illustrated and described, it will be obvious to those skilled in the art that various modifications may be made without departing from what is intended to be limited solely by the appended claims.

What is claimed is:

1. A method for forming a photo-sensitive device, the method comprising:

providing a substrate with a photo-receiving region formed therein;

forming a first transparent, planarized insulator layer on said substrate;

forming one color filter pattern on and adjacent to said photo-receiving region of said first insulator layer, wherein the portion of said first insulator layer one color filter formed on is at least less or equal than said photo-receiving region;

forming a conductive layer on and adjacent to said first insulator layer; and forming a second insulator layer on a partially fabricated device.

2. The method according to claim 1, wherein said step of forming a conductive layer on said substrate comprises:

depositing a conformal conductive layer over a partially fabricated device;

forming a photoresist layer over said conductive layer and transferring a pattern at least larger than a photo-receiving region into said photoresist layer;

removing said conductive layer using said photoresist layer as a mask; and removing said photoresist layer.

3. The method according to claim 1, wherein said insulator layer is a passivation layer.

4. The method according to claim 1, wherein said conductive layer is a metal layer.

5. A method for forming a photo-sensitive device, the method comprising:

providing a planarized insulator with a photo-receiving region formed therein;

forming one color filter pattern on and adjacent to said photo-receiving region;

forming a conductive layer on and adjacent to said insulator; and forming a passivation layer over a partially fabricated device.

6. The method according to claim 5, wherein said conductive layer is a metal layer.

7. The method according to claim 5, wherein said step of forming a conductive layer on said insulator comprises:

forming a conformal conductive layer over a partially fabricated device;

forming a photoresist layer on said conductive layer and transferring a pattern at least larger than said photo-sensitive region into said photoresist layer;

removing a portion of said conductive layer being left uncovered by said photoresist layer;

removing said photoresist layer.

8. The method according to claim 5, wherein said insulator is transparent.

9. A method for forming a photosensor device, the method comprising:

providing a substrate with a photo-receiving region formed therein;

providing a transparent, planarized insulator layer on said substrate;

forming one color filter pattern on and adjacent to said photo-receiving region of said insulator layer;

depositing a conformal conductive layer on and adjacent to said partially fabricated device;

forming a photoresistor layer on said conductive layer and transferring a pattern at least larger than said photo-receiving region into said photoresistor layer;

removing said conductive layer using said photoresistor layer as a mask;

removing said photoresistor layer; and depositing a passivation layer on a partially fabricated device.

10. The method according to claim 9, wherein said conductive layer is metal layer.

* * * * *